US009343053B2

(12) United States Patent
Harel

(10) Patent No.: US 9,343,053 B2
(45) Date of Patent: May 17, 2016

(54) ADDING AUDIO SOUND EFFECTS TO MOVIES

(71) Applicant: Sound In Motion Ltd., Tel Aviv (IL)

(72) Inventor: Zion Harel, Ramat HaSharon (IL)

(73) Assignee: SOUND IN MOTION, Tel-Aviv (IL)

( * ) Notice: Subject to any disclaimer, the term of this patent is extended or adjusted under 35 U.S.C. 154(b) by 70 days.

(21) Appl. No.: 14/271,472

(22) Filed: May 7, 2014

(65) Prior Publication Data

US 2014/0334630 A1 Nov. 13, 2014

Related U.S. Application Data

(60) Provisional application No. 61/822,450, filed on May 13, 2013.

(51) Int. Cl.

| | |
|---|---|
| ***H03G 3/00*** | (2006.01) |
| ***G10H 1/36*** | (2006.01) |
| ***G10H 5/02*** | (2006.01) |

(52) U.S. Cl.

CPC ................ *G10H 1/368* (2013.01); *G10H 5/02* (2013.01); *G10H 2220/096* (2013.01); *G10H 2240/145* (2013.01); *G10H 2240/325* (2013.01)

(58) Field of Classification Search

None

See application file for complete search history.

(56) References Cited

U.S. PATENT DOCUMENTS

| | | | | |
|---|---|---|---|---|
| 6,404,893 | B2 | 6/2002 | Iori | |
| 7,333,934 | B1 | 2/2008 | Carson | |
| 7,778,823 | B2 | 8/2010 | Carson | |
| 8,006,186 | B2 | 8/2011 | Kellock et al. | |
| 2006/0122842 | A1* | 6/2006 | Herberger et al. | 704/278 |
| 2014/0218311 | A1* | 8/2014 | Huang et al. | 345/173 |

* cited by examiner

*Primary Examiner* — Andrew L Sniezek

(57) ABSTRACT

A method of adding sound effects to movies, comprising: opening a file comprising audio and video tracks on a computing device comprising a display and touch panel input mode; running the video track on the display; selecting an audio sound suitable to a displayed frame from an audio sounds library; and adding audio effects to said selected audio sound using hand gestures on displayed art effects.

22 Claims, 9 Drawing Sheets

ADDING AUDIO SOUND EFFECTS TO MOVIES

CROSS-REFERENCE TO RELATED PATENT APPLICATIONS

This patent application claims priority from and is related to U.S. Provisional Patent Application Ser. No. 61/822,450, filed May 13, 2013, this U.S. Provisional Patent Application incorporated by reference in its entirety herein.

TECHNOLOGY FIELD

The present invention relates to adding sound effects to movies.

BACKGROUND

The process of adding the right sound effects to movies is done by one of the following two methods, or by a combination thereof:

a. Foley—the reproduction of everyday sound effects which are added in post production to enhance the quality of audio for films, television, video, video games and radio. These reproduced sounds can be anything from the swishing of clothing and footsteps to squeaky doors and breaking glass. Foley artists look to recreate the realistic ambient sounds that the film portrays. The props and sets of a film do not react the same way acoustically as their real life counterparts. Foley sounds are recorded in a recording studio where the foley artist "acts" the sound effects in real time while watching the video.

b. Spotting—the process of using pre-recorded audio samples and placing them one by one on a time line in a Digital Audio Workstation. This is typically done with software such as Pro Tools (by www.avid.com), which is a DAW for recording and editing in music production, film scoring, film and television post production, musical notation and MIDI (Musical Instrument Digital Interface) sequencing. Fundamentally, Pro Tools, like all Digital Audio software, is similar to an analogue multi-track tape recorder and mixer.

SUMMARY

The present invention provides a method of adding sound effects to movies, comprising: opening a file comprising audio and video tracks on a computing device comprising a display and touch panel input mode; running the video track on the display; selecting an audio sound suitable to a displayed frame from an audio sounds library; and adding audio effects to said selected audio sound using hand gestures on displayed art effects. Selecting an audio sound may comprise selecting an audio sound category, wherein said displayed art effects are selected based on said selected category. Adding audio effects may comprise tapping on said displayed art effects. The audio effect may depend on at least one of said tapping direction, said tapping strength, said tapping area and a sub-category selected. Adding audio effects may comprise applying force and direction to said displayed art effects. The length and strength of the touch gesture may modulate the sound. Adding audio effects may comprise operating at least one toggle switch on said displayed art effects. Operating said at least one toggle switch may create a continuous audio effect.

BRIEF DESCRIPTION OF THE DRAWINGS

For a better understanding of the invention and to show how the same may be carried into effect, reference will now be made, purely by way of example, to the accompanying drawings.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice. In the accompanying drawings.

DETAILED DESCRIPTION OF EMBODIMENTS

Figure 1:
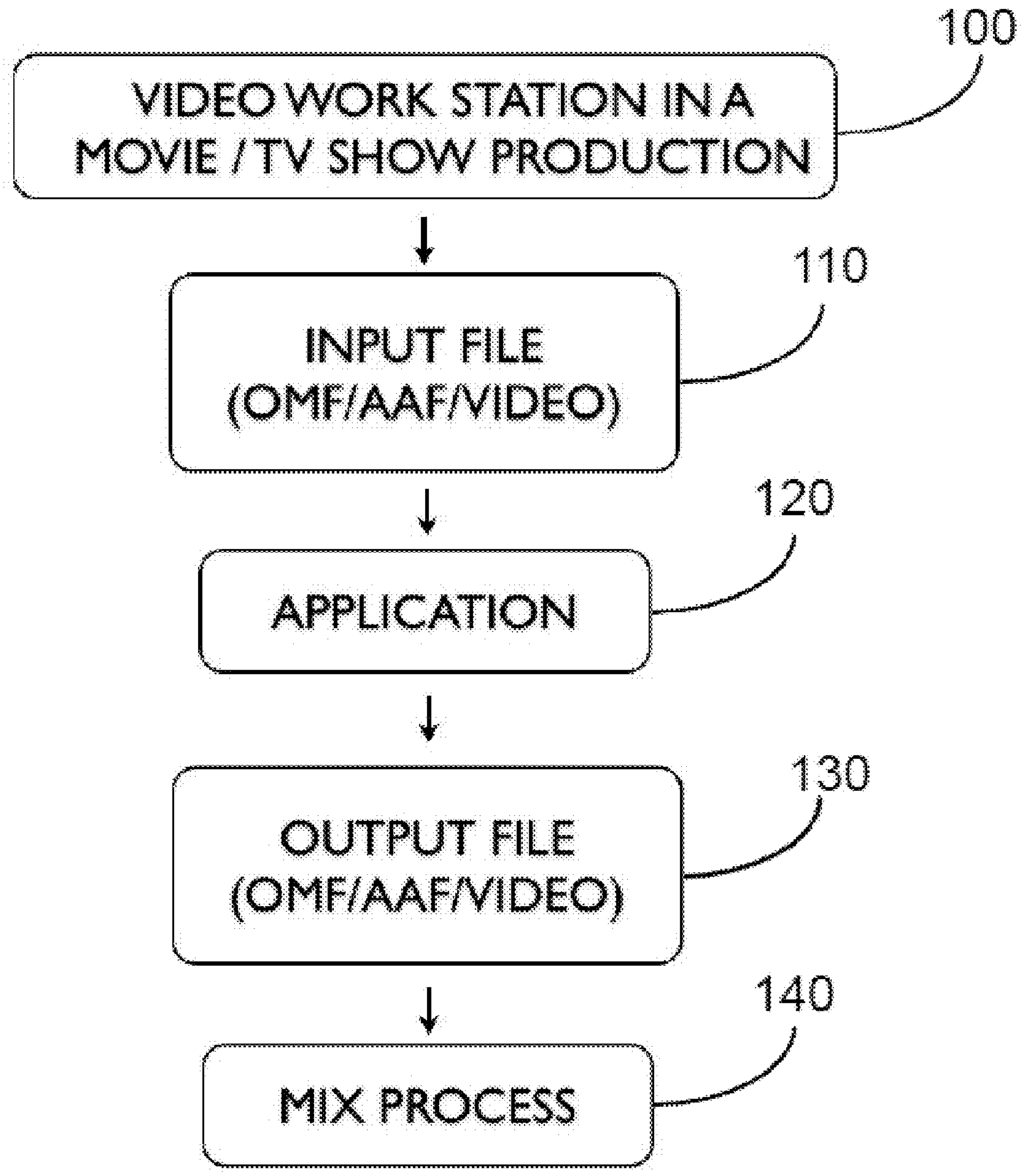
FIG. 1 is a schematic block diagram showing the application's place in the video editing workflow.

For the purposes of promoting and understanding the principles of the invention, reference will now be made to the embodiments illustrated in the drawings, which are described below. The embodiments disclosed below are not intended to be exhaustive or limit the invention of the precise form disclosed in the following detailed description. Rather, the embodiments are chosen and described so that others skilled in the art may utilize their teachings. It will be understood that no limitation of the scope of the invention is thereby intended. The invention includes any alterations and further modifications in the illustrated devices and described methods and further applications of the principles of the invention will normally occur to one skilled in the art to which the invention relates. The present invention provides a new and improved method of adding sound effects to movies. The method is carried out by a touch-screen application which may be operated on any computing device having a touch screen which operates as an input means, such as a tablet computer, a desktop computer connected to a touch screen, a Smartphone, etc.

Figure 2:
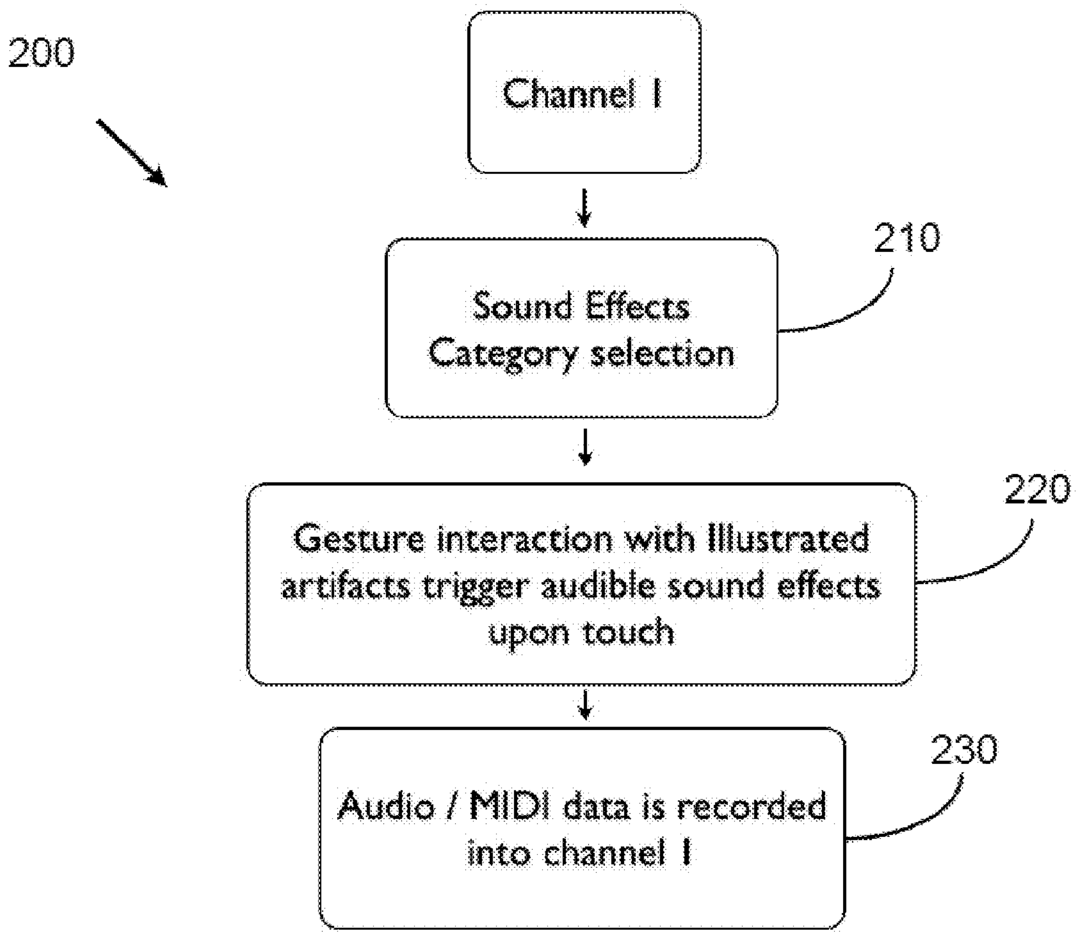
FIG. 2 is a general flowchart showing the main parts of the application.
Figure 3:
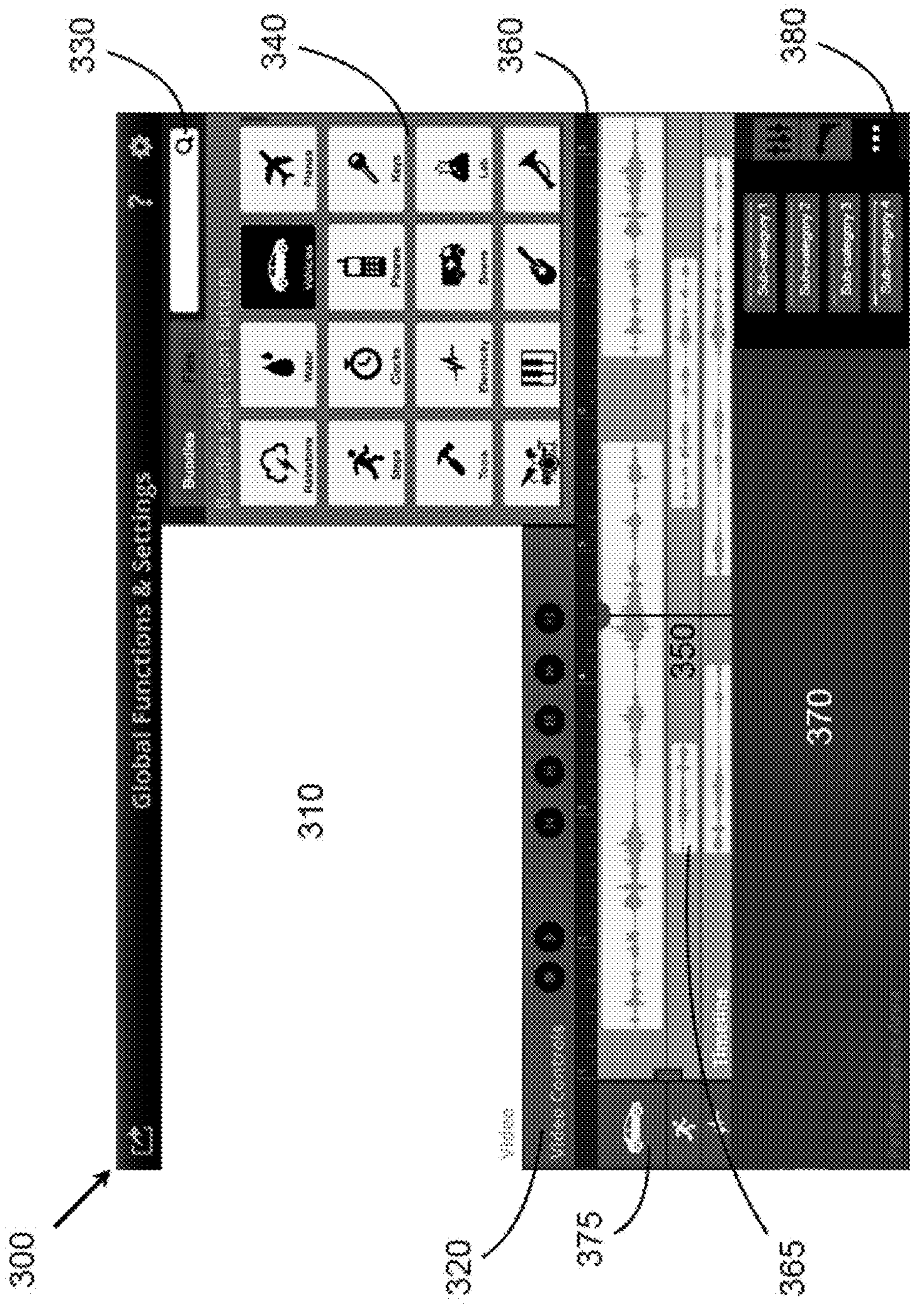
FIG. 3 shows a schematic exemplary arrangement of the application screen.
Figure 4:
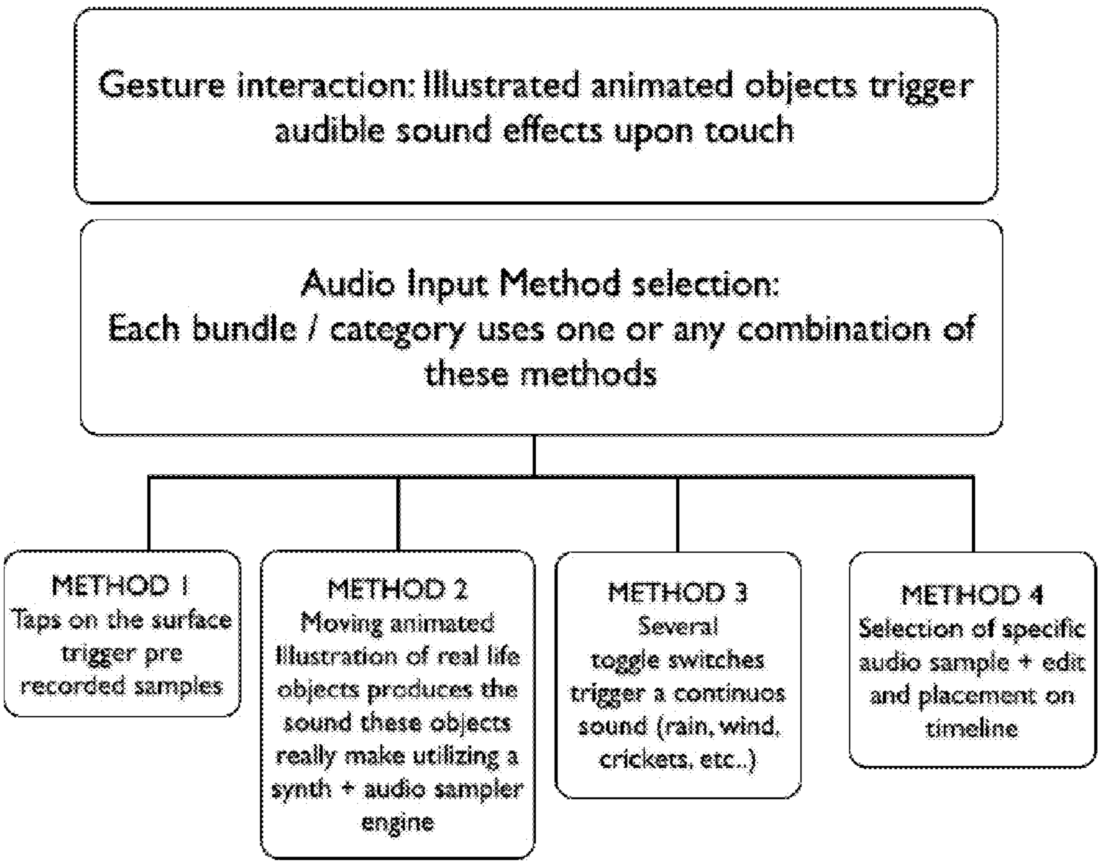
FIG. 4 is a schematic block diagram showing the various user interaction methods supported by the application according to the selected category.
Figure 5:
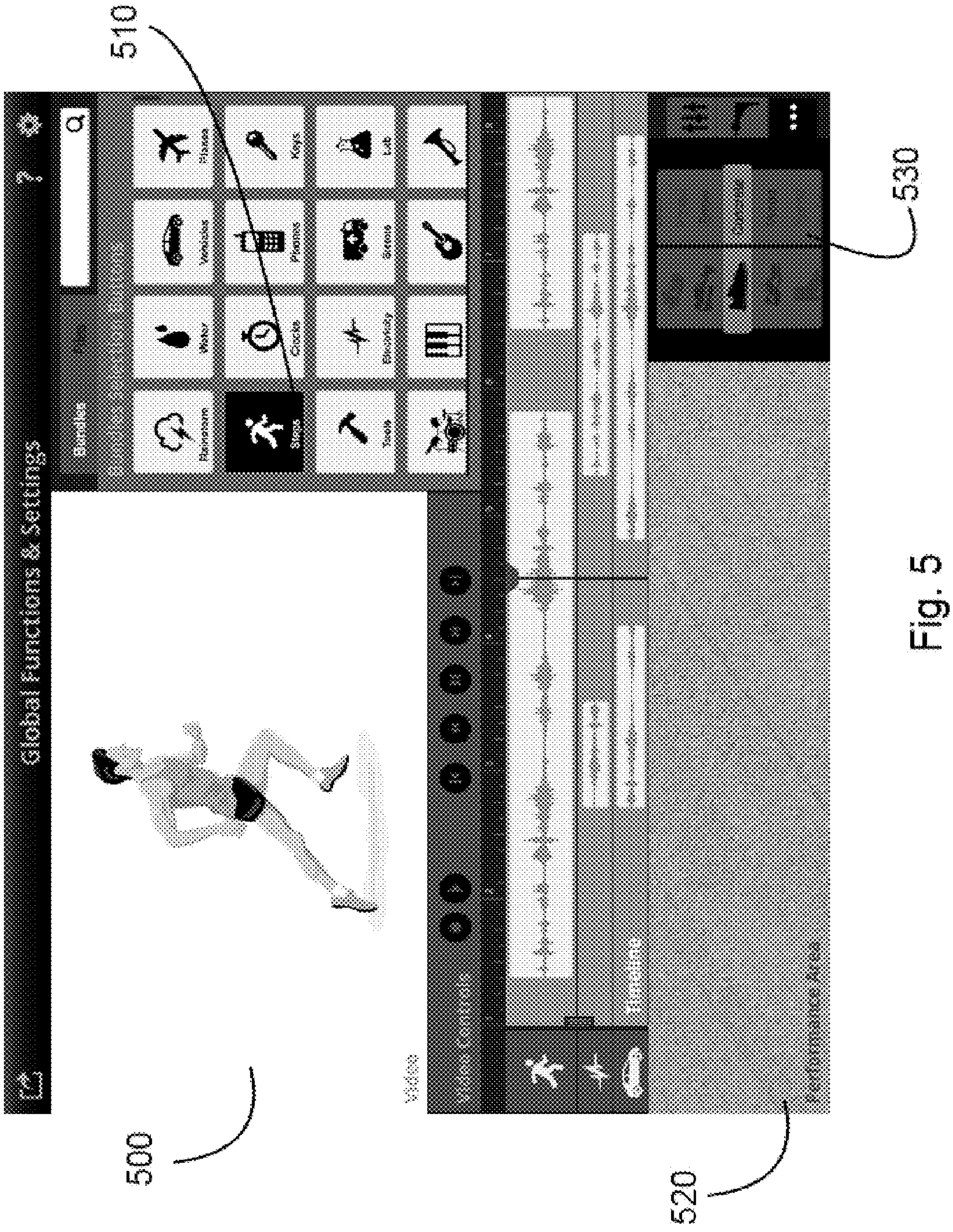
FIG. 5 shows a schematic exemplary arrangement of the application screen when using method 1.
Figure 6:
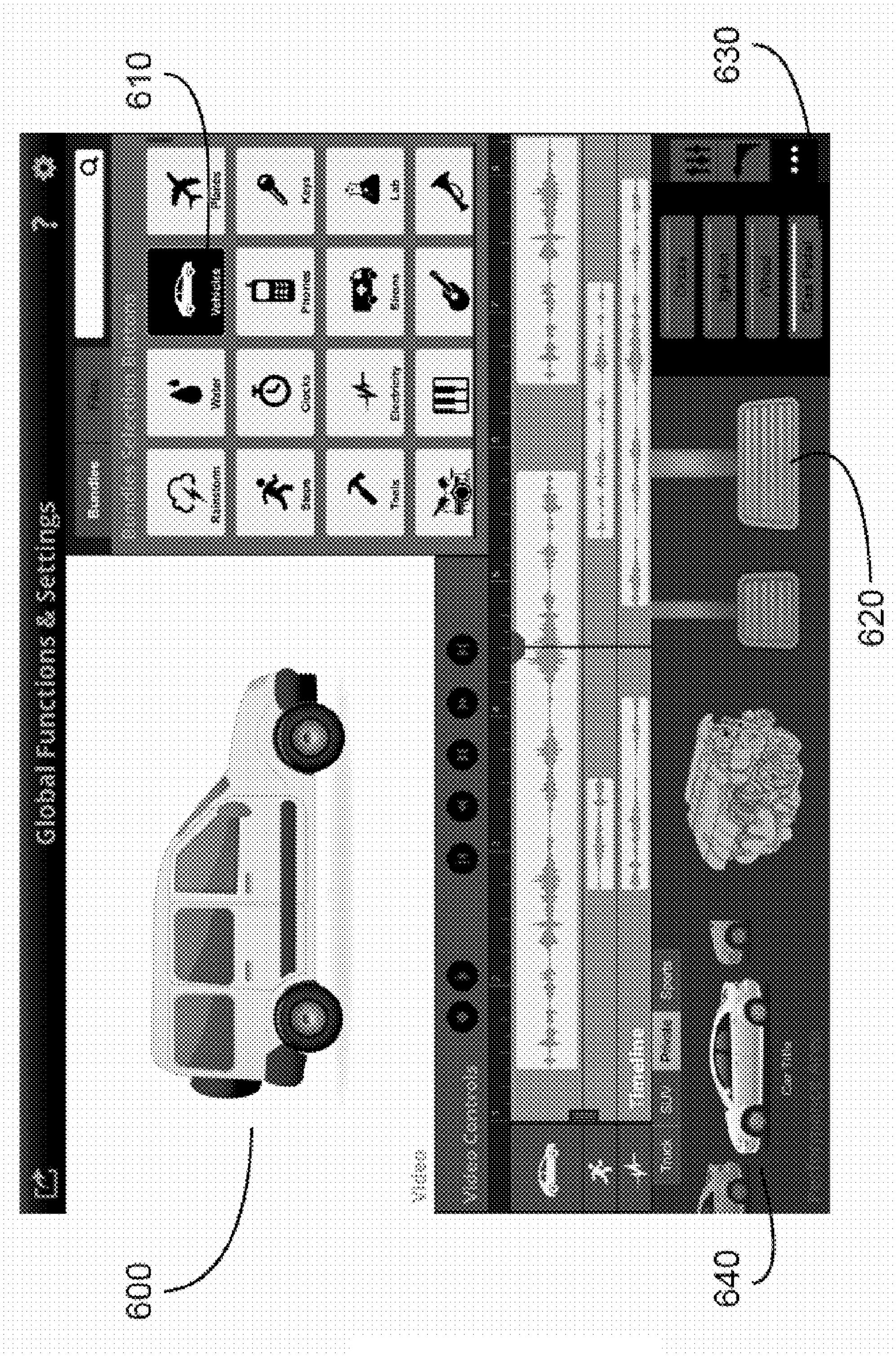
FIG. 6 shows a schematic exemplary arrangement of the application screen when using method 2.
Figure 7:
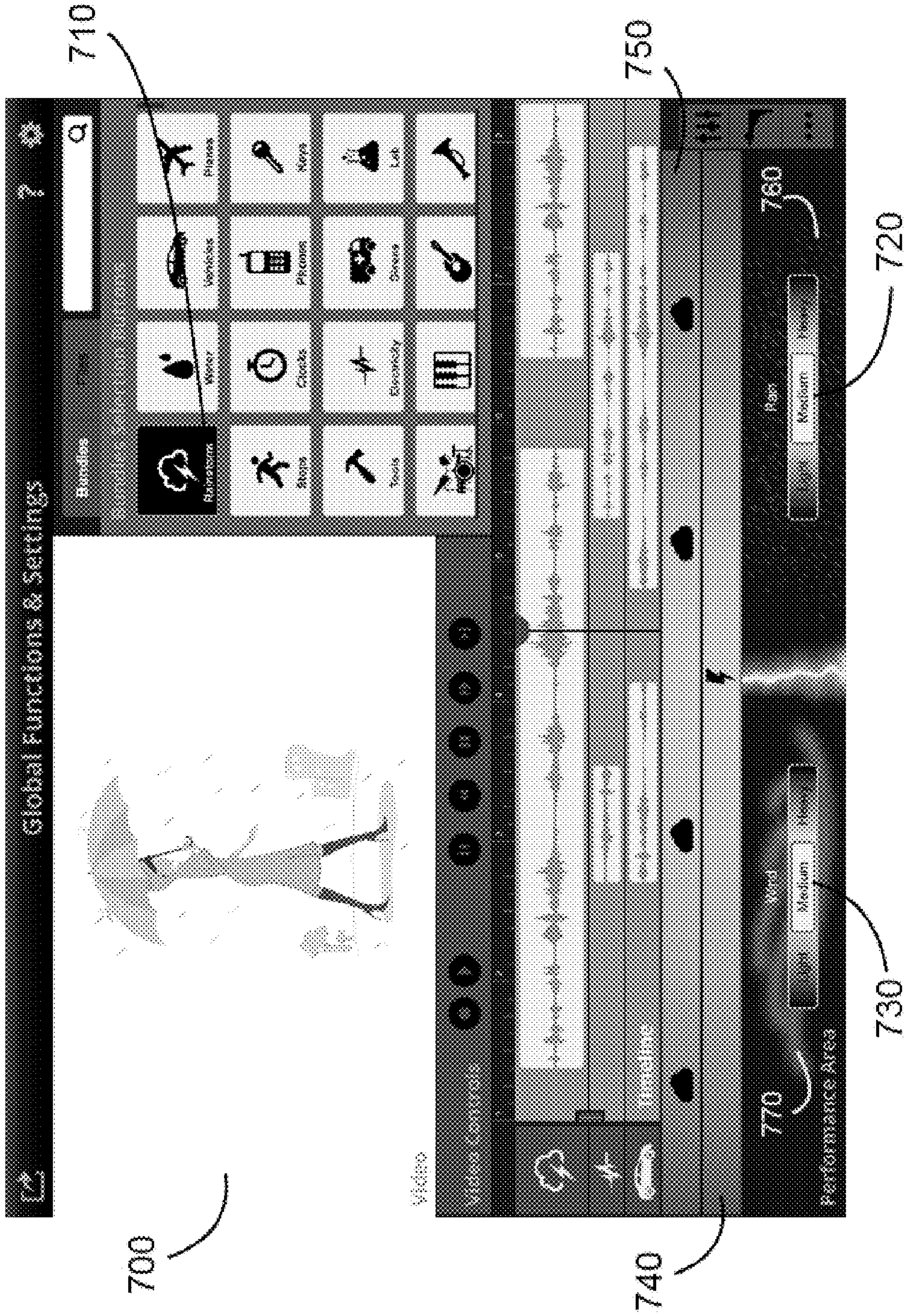
FIG. 7 shows a schematic exemplary arrangement of the application screen when using method 1, 2 & 3 in conjunction.

The application can open standard audio/video format files such OMF (Open Media Framework) or AAF (Advanced Authoring Format) or any other file format that contains complex multimedia and metadata information (video and the audio channels in a given session including the audio regions along with time code, any audio automation and any other session data brought forward digitally from the video work station). The application enables the user to add, adapt and modulate pre-recorded sound effects using hand gestures as a mean of "acting" the scene. FIG. 1 is a schematic block diagram showing the application's place in the video editing workflow. The application 120 receives an audio/video format file 110 created by a video editing work station 100, adds audio effects to the sound track and outputs the enhanced multimedia information in an audio/video format file 130 to be further processed by a mixing process 140. The application may add any required number of audio channels to the project. FIG. 2 is a general flowchart 200 showing the main parts of the application 100, as applied to one of the added channels—channel I. In step 210 the user selects a category of sound effects from a library of predefined categories. The category selection triggers display of appropriate art effects. In step 220 the user interacts with the displayed art effects by various touch gestures to trigger audible sound effects, as explained in more detail in conjunction with FIG. 3. The sound effects are recorded into channel I (step 230). The sound effect produced by the user's interaction with the application screen comprises a number of levels: the software instrument containing the pre-defined audio samples in the system, triggered by a MIDI note which is produced by touching the screen. The amplitude envelope of the sound samples as well as other real time effects (e.g. modulation) are controlled by the user's touch gesture. FIG. 3 shows a schematic exemplary arrangement of the application screen 300 according to embodiments of the present invention, comprising the following windows:

- Video window 310 for displaying the video while adding sound effects in real time;
- Video controls window 320 comprising standard video controls such as play, pause, rewind, fast forward and step back/forward by one (or more) frames (buttons are customizable)
- Search field window 330 for textual search of a category;
- Category selection window 340 for selecting an audio theme category from a list of displayed category names or icons;
- Timeline 350 for displaying a time-code ruler 360 and audio regions 365 showing already recorded regions for each channel 375 along the timeline;
- Performance area 370, serving as a touch panel for producing the different sound effects by applying gestures over a displayed background and art effects of the selected audio theme;
- Sub-category selection area 380 for refining the category selection. FIG. 4 is a schematic block diagram showing the various exemplary user interaction methods supported by the application according to the selected category. The methods may be used separately or in combination to produce the required sound effects. According to embodiments of the present invention the methods comprise at least:
- Method 1: Taps on the performance area trigger pre-recorded samples modulated by tap parameters such as length, strength and place of touch;
- Method 2: Applying force and direction to animated illustrations of real life objects produces the sound these objects make in real life by themselves or by interacting with a typical environment, utilizing an audio sampler engine in combination with a synthesizer while the gesture is controlling the pre defined audio properties (amplitude envelope, filters, modulators, oscillators, LFO's and other dynamic and synthesizer properties);
- Method 3: Several toggle switches trigger a continuous sound;
- Method 4: Selecting a pre-recorded sample from a list, trimming the length of the waveform, adjusting the amplitude envelope of the sound sample and placing it on a given channel in the timeline by dragging and dropping it. FIG. 5 shows a schematic exemplary arrangement of the application screen when using method 1. In the example of FIG. 5, the video depicts a running man 500. In the category selection window the button depicting footsteps 510 is selected and in the performance area there is displayed a concrete floor 520 and Sub-category selection area 530 for refining the category selection to specific floor and shoe type is displayed. Each tap on the performance area triggers the creation of a footstep sound, in this example—a sports shoe on a concrete floor. The footstep sound may vary, for example, according to:
- Tapping direction: e.g. tapping on the right area will trigger a footstep sample in low volume (or low midi velocity) so "walking" from right to left will make the sound of footsteps getting closer;
- Tapping strength: a stronger tap may produce a heavier footstep sound;
- Tapping area: the far left corner could trigger the "scuff" sound of a footstep;
- Background selection, e.g. snow or concrete and/or shoe type selection, e.g. sports or stiletto in the sub-category menu 530 may produce different footstep sounds. FIG. 6 shows a schematic exemplary arrangement of the application screen when using method 2. In the example of FIG. 6, the video depicts a moving car 600. In the category selection window the button depicting a car 610 is selected and in the performance area the sub-category "Gas pedal" 630 is selected and there is displayed a car engine with a gas and a brake pedal 620. Pushing the gas pedal image triggers a pre-recorded sample of an engine. The length and strength of the touch gesture modulates the sound appropriately to resemble the sound of a real engine. Other selections in the sub category menu 630 may enable access to other parts of the car such as wheels, doors, etc. A second sub-category selection means 640 may enable the selection of various types of cars or engines. FIG. 7 shows a schematic exemplary arrangement of the application screen when using methods 1, 2 and 3 in conjunction. In the example of FIG. 7, the video depicts a rainy movie scene 700. In the category selection window the button depicting rainstorm 710 is selected and in the performance area two toggle switches for selecting rain strength 720 and wind strength 730 are displayed (both representing method 3). The toggle switches' settings trigger respective continuous sounds of rain and wind, enabling various types of continuous ambient sound (in this example—light, medium, heavy or none), illustrated animations of rain (760)/wind (770) will appear in the performance area, giving a visual indication of the strength of the selected sound (light, medium or heavy wind/rain sound).

Figure 8:
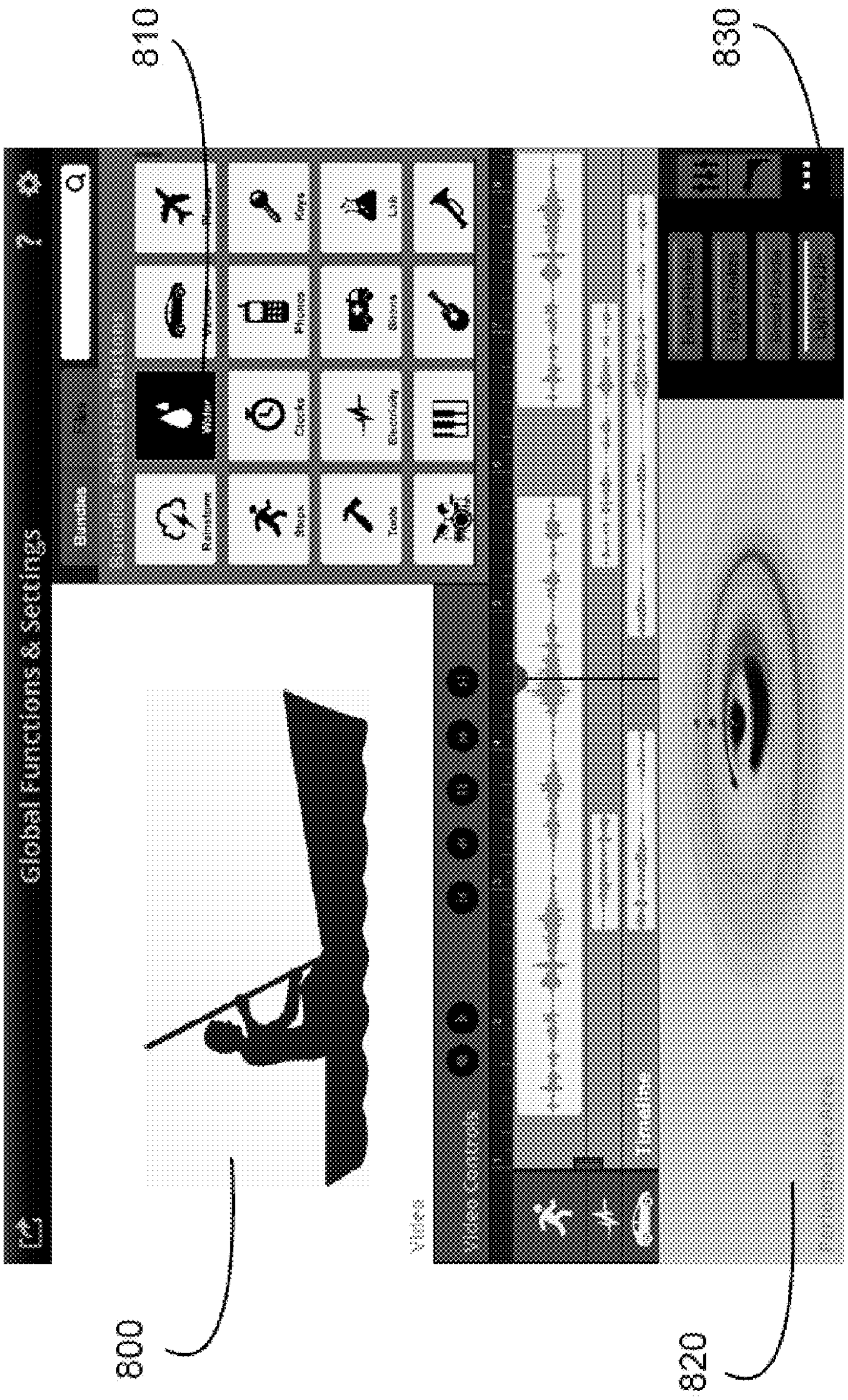
FIG. 8 shows a schematic exemplary arrangement of the application screen when using method 2.
Figure 9:
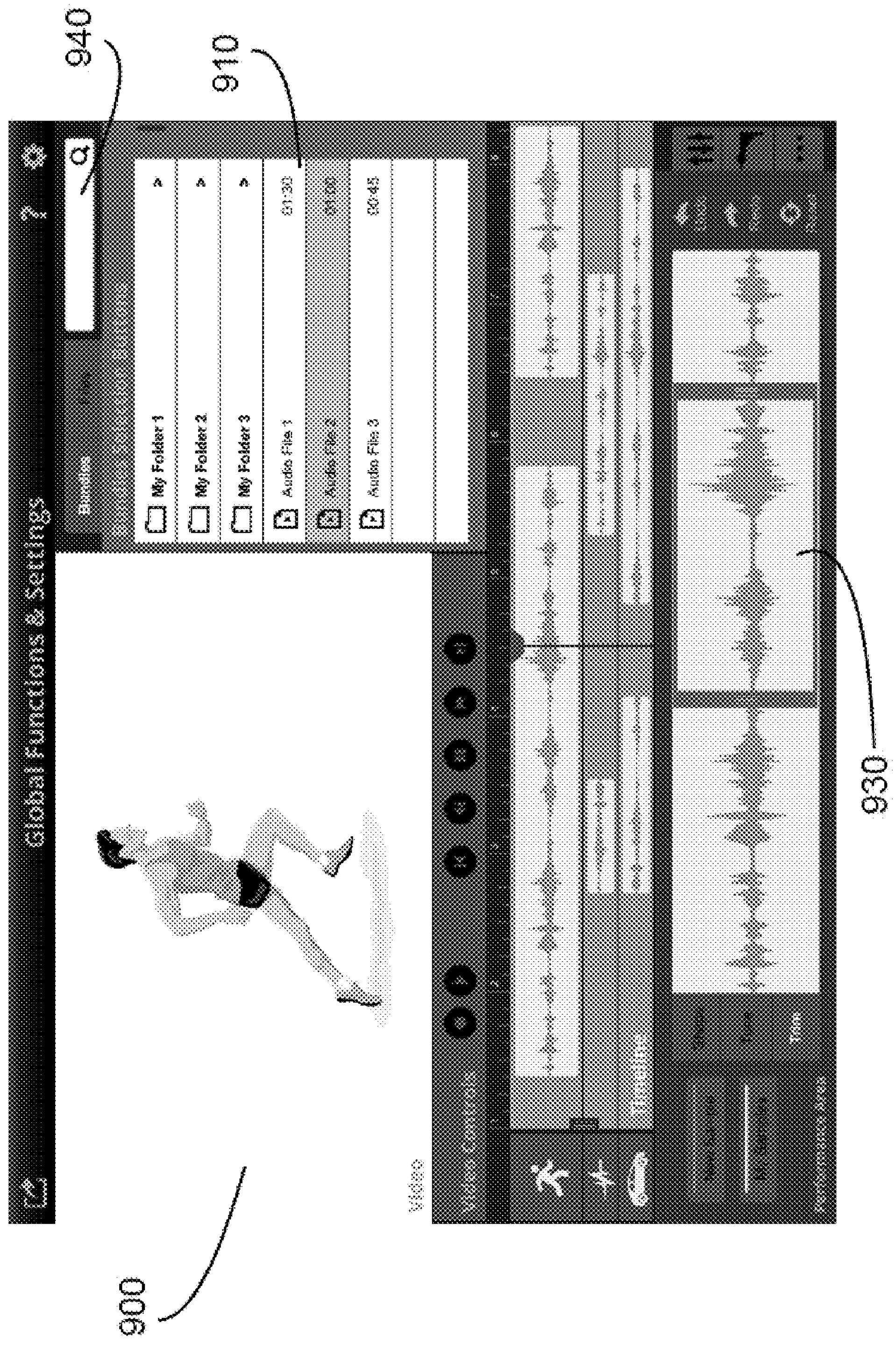
FIG. 9 shows a schematic exemplary arrangement of the application screen when using method 4.

In the example of FIG. 7, the performance area includes two additional sub-areas which display two strips (these represent method 1 and 2): tapping/swiping 740 may trigger a sound sample of a lightning strike close by where the selected sample and it's properties may vary based on the user's gesture and its location on the strip. On the upper strip 750, dragging the little cloud art effects will generate a continuous sound sample of a thunder rumble, the reverberation length and character of this sound sample as well as it's amplitude envelope will vary based on the user's touch gesture. FIG. 8 shows another schematic exemplary arrangement of the application screen when using method 2. In the example of FIG. 8, the video depicts a person rowing in a boat 800. In the category selection window the button depicting water 810 is selected and in the performance area there is displayed a water animation 820. By dragging a finger on the water animation, the strength, duration and trajectory of the gesture may trigger and define the sound properties of the pre-recorded rowing sound (properties like amplitude envelope, modulation, filters, etc.). A sub-category selection menu 830 may enable the selection of various types of boat paddles, number of simultaneous paddles rowing together, stroke sample character (light or broad), etc. FIG. 9 shows a schematic exemplary arrangement of the application screen when using method 4. In the example of FIG. 9, the video depicts a man running. In the category selection window there is displayed a list view showing files and folders, which enables the selection of a specific audio sample from the audio samples library. The selected audio sample will appear in the performance area 930 and may be edited (trimmed, reversed, tuned or have its amplitude envelope edited) and placed on the timeline, as known in the art of audio editing. New audio samples may also be recorded into the user's database. These audio samples may include metadata which will be read and sorted into categories on a list view, and can be searched using the search bar text box 940.

According to embodiments of the invention, the user may alternatively interact with the application using a mouse, a stylus, a "hover over" screen, physical movement interaction utilizing accelerometers and gyroscope capabilities of various hardware, or any other input method enabling the user to perform at least one of the methods described above for interacting with the application to produce the desired sound effect.

User Delay Compensation:

Every end user has his own response time when interacting with the application. The typical user will first see when he has to add a given sound effect (example a door-slam) and only then react and press the performance area. The time lapse between the moment in the video when the door was slammed and the moment the user interacted with the performance area to add that sound—is called "User response time".

The system of the present invention "learns" each user's response time and places the applied audio sample X time units earlier than the moment it was initiated, where X represents the user's response time.

In a calibration procedure, the user is asked to first add sound effects to a given scene, those effects will be placed with a delay (the user's response time) on the timeline, then the user is asked to manually move the recorded audio regions along the time line to their proper position. If the user moved an audio region 70 milliseconds backward—then the system notes that this user is typically late by ~70 milliseconds when adding a door-slam sound effect. If the user applies the calibration process again, the system will make a note of the average response time of the user. This calibration may be done per a number of samples, so that after the user has calibrated all the samples he should be able to work normally (without manually dragging regions backward) and still have his composition in sync.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

TERMS GLOSSARY

Foley: the reproduction of everyday sound effects which are added in post production to enhance the quality of audio for films, television, video, video games and radio. These reproduced sounds can be anything from the swishing of clothing and footsteps to squeaky doors and breaking glass. The best foley art is so well integrated into a film that it goes unnoticed by the audience. It helps to create a sense of reality within a scene. Without these crucial background noises, movies feel unnaturally quiet and uncomfortable. Foley artists look to recreate the realistic ambient sounds that the film portrays. The props and sets of a film do not react the same way acoustically as their real life counterparts. Foley sounds are used to enhance the auditory experience of the movie. Foley can also be used to cover up unwanted sounds captured on the set of a movie during filming, such as overflying airplanes or passing traffic. Nowadays pre-recorded libraries of Foley sound samples are available for purchase by a variety of vendors, and so editing such samples in a 'Drag and Drop' method has become common since the introduction of DAW's such as Protools.

DIGITAL AUDIO WORKSTATION (DAW): An electronic system designed solely or primarily for recording, editing and playing back digital audio. DAWs were originally tape-less, microprocessor-based systems such as the Synclavier. Modern DAWs are software running on computers with audio interface hardware.

OMF: Open Media Framework (OMF), also known as Open Media Framework Interchange (OMFI) is a platform-independent file format intended for transfer of digital media between different software applications. All common Digital Audio and Video Workstations support importing/exporting of the OMF file format. The OMFI is a common interchange framework developed in response to an industry-led standardisation effort (including Avid, a major digital video hardware/applications vendor). Like QuickTime, the primary concern of the OMFI format is concerned with temporal representation of media (such as video and audio) and a track model is used. The primary emphasis is video production and a number of additional features reflect this: Source (analogue) material object represent videotape and film so that the origin of the data is readily identified. Final footage may resort to this original form so as to ensure highest possible quality. Special track types store (SMPTE) time codes for segments of data. Transitions and effects for overlapping and sequences of segments are predefined. Motion Control—the ability to play one track at a speed which is a ratio of the speed of another track is supported.

The OMFI file format incorporates:

Header—includes indices for objects contained in file

Object dictionary—to enhance the OMFI class hierarchy in an application

Object data

Track data

AAF: The Advanced Authoring Format (AAF) is a professional file interchange format designed for the video post production and authoring environment. The AAF was created by the Advanced Media Workflow Association (AMWA). The AMWA develops specifications and technologies to facilitate the deployment and operation of efficient media workflows. The AMWA works closely with standards bodies like the SMPTE. Technical work of the AMWA is through projects that strive for compatibility between AAF (Advanced Authoring Format), BXF, MXF (Material Exchange Format) and XML. The current projects fall into three categories: data models, interface specifications, and application specifications. AAF was created to help address the problem of multi-vendor, cross-platform interoperability for computer-based digital video production. There are two kinds of data that can be interchanged using AAF: Audio, video, still image, graphics, text, animation, music, and other forms of multimedia data. In AAF these kinds of data are called essence data, because they are the essential data within a multimedia program that can be perceived directly by the audience multimedia program. Data that provides information on how to combine or modify individual sections of essence data or that provides supplementary information about essence data. In AAF these kinds of data are called metadata, which is defined as data about other data. The metadata in an AAF file can provide the information needed to combine and modify the sections of essence data in the AAF file to produce a complete multimedia program.

SOFTWARE INSTRUMENT: A software instrument can be a synthesized version of a real instrument (like the sounds of a violin or drums), or a unique instrument, generated by computer software. Software instruments have been made popular by the convergence of synthesizers and computers, as well as sequencing software like GarageBand, Logic Pro (geared toward professionals), the open source project Audacity, and Ableton Live which is geared towards live performances. Also of note is software like Csound and Nyquist, which can be used to program software instruments. A software instrument is akin to a soundfont.

MIDI: short for Musical Instrument Digital Interface, is a technical standard that describes a protocol, digital interface and connectors and allows a wide variety of electronic musical instruments, computers and other related devices to connect and communicate with one another. A single MIDI link can carry up to sixteen channels of information, each of which can be routed to a separate device. MIDI carries event messages that specify notation, pitch and velocity, control signals for parameters such as volume, vibrato, audio panning and cues, and clock signals that set and synchronize tempo between multiple devices. These messages are sent to other devices where they control sound generation and other features. This data can also be recorded into a hardware or software device called a sequencer, which can be used to edit the data and to play it back at a later time. MIDI technology was standardized in 1983 by a panel of music industry representatives, and is maintained by the MIDI Manufacturers Association (MMA). All official MIDI standards are jointly developed and published by the MMA in Los Angeles, Calif., USA, and for Japan, the MIDI Committee of the Association of Musical Electronics Industry (AMEI) in Tokyo.

AMPLITUDE ENVELOPE: Also known as ADSR envelope; When an acoustic musical instrument produces sound, the loudness and spectral content of the sound change over time in ways that vary from instrument to instrument. The "attack" and "decay" of a sound have a great effect on the instrument's sonic character. Sound synthesis techniques often employ an envelope generator that controls a sound's parameters at any point in its duration. Most often this is an "ADSR" (Attack Decay Sustain Release) envelope, which may be applied to overall amplitude control, filter frequency, etc. The envelope may be a discrete circuit or module, or implemented in software. The contour of an ADSR envelope is specified using four parameters:

Attack time is the time taken for initial run-up of level from nil to peak, beginning when the key is first pressed.

Decay time is the time taken for the subsequent run down from the attack level to the designated sustain level.

Sustain level is the level during the main sequence of the sound's duration, until the key is released.

Release time is the time taken for the level to decay from the sustain level to zero after the key is released.

REAL TIME EFFECTS: Sound changing effects such as Reverb, Delay, Flanger and others which are known in the art of Digital Sound Processing. Such effects can change the sound of a given signal, or produce a separate signal (based on a given input sound signal) during playback in a digital audio workstation.

MODULATION: In audio and music frequency modulation synthesis (or FM synthesis) is a form of audio synthesis where the timbre of a simple waveform is changed by frequency modulating it with a modulating frequency that is also in the audio range, resulting in a more complex waveform and a different-sounding tone. The frequency of an oscillator is altered or distorted, "in accordance with the amplitude of a modulating signal." (Dodge & Jerse 1997, p. 115) FM synthesis can create both harmonic and inharmonic sounds. For synthesizing harmonic sounds, the modulating signal must have a harmonic relationship to the original carrier signal. As the amount of frequency modulation increases, the sound grows progressively more complex. Through the use of modulators with frequencies that are non-integer multiples of the carrier signal (i.e. non harmonic), bell-like dissonant and percussive sounds can easily be created.

FM synthesis using analog oscillators may result in pitch instability, but FM synthesis can be implemented digitally, and the latter proved so much more reliable that it became the standard. As a result, digital FM synthesis (using the more frequency-stable phase modulation variant) was the basis of Yamaha's groundbreaking DX7, which brought FM to the forefront of synthesis in the mid-1980s. The technique of the digital implementation of frequency modulation, which was developed by John Chowning (Chowning 1973, cited in Dodge & Jerse 1997, p. 115) at Stanford University in 1967-68, was patented in 1975 and later licensed to Yamaha. The implementation commercialized by Yamaha (U.S. Pat. No. 4,018,121 April 1977 or U.S. Pat. No. 4,018,121) is actually based on phase modulation, but the results end up being equivalent mathematically, with phase modulation simply making the implementation resilient against undesirable drift in frequency of carrier waves due to self-modulation or due to DC bias in the modulating wave. As noted earlier, FM synthesis was the basis of some of the early generations of digital synthesizers from Yamaha, with Yamaha's flagship DX7 synthesizer being ubiquitous throughout the 1980s and several other models by Yamaha providing various variations of FM synthesis. The most advanced FM synths produced by Yamaha were the 6-operator keyboard SY99 and the 8-operator module FS1 R: each features Yamaha's Advanced FM (AFM) alongside and able to be layered or interfaced with other synthesizing technologies, respectively AWM2 (Advanced Wave Memory 2) sample-based synthesis in the SY99 and format synthesis in the FS1R, neither of which combinations have ever been duplicated, as neither have some of the other advanced FM features of these Yamaha devices. Yamaha had patented its hardware implementation of FM in the 1980s, allowing it to nearly monopolize the market for that technology until the mid-1990s. Casio developed a related form of synthesis called phase distortion synthesis, used in its CZ range of synthesizers. It had a similar (but slightly differently derived) sound quality to the DX series. Don Buchla implemented FM on his instruments in the mid-1960s, prior to Yamaha's patent. His 158, 258 and 259 dual oscillator modules had a specific FM control voltage input, and the model 208 (Music Easel) had a modulation oscillator hard-wired to allow FM as well as AM of the primary oscillator. These early applications used analog oscillators.

With the expiration of the Stanford University FM patent in 1995, digital FM synthesis can now be implemented freely by other manufacturers. The FM synthesis patent brought Stanford $20 million dollars before it expired, making it (in 1994) "the second most lucrative licensing agreement in Stanford's history". FM today is mostly found in software-based synths such as FM8 by Native Instruments, but it has also been incorporated into the synthesis repertoire of some modern digital synthesizers, usually coexisting as an option alongside other methods of synthesis such as subtractive, sample-based synthesis, additive synthesis, and other techniques. The degree of complexity of the FM in such hardware synths may vary from simple 2-operator FM, to the highly flexible 6-operator engines of the Korg Kronos and Alesis Fusion, to creation of FM in extensively modular engines such as those in the latest synthesizers by Kurzweil Music Systems.

AUDIO REGION: Essence data in the form of an audio file, or part of an audio file which is represented as a displayed waveform-clip in a given software's user interface.

Non-Linear Editing: A non-linear editing system (NLE) is a video—(NLVE) or audio editing (NLAE) digital audio workstation (DAW) system that performs non-destructive editing on source material. The name is in contrast to 20th century methods of linear video editing and film editing.

The invention claimed is:

1. A method of interactively adding sound effects to movies, comprising:

opening a file comprising audio and video tracks on a computing device having a display, said display comprising a video display window and a performance area;

running said video track in said display window; and applying a sound effect in real-time, in accordance with said displayed video track, using hand gestures applied to art effects displayed in said performance area.

2. The method of claim 1, further comprising selecting a category from a category selection window; wherein said sound effect is based on said selected category and wherein said displayed art effects are based on said selected category.

3. The method of claim 1, wherein applying said sound effect comprises tapping on said displayed art effects.

4. The method of claim 3, wherein said sound effect depends on at least one of the direction of said tapping, the strength of said tapping, the area of said tapping and a sub-category selected.

5. The method of claim 1, wherein applying said sound effect comprises applying force and direction to said displayed art effects.

6. The method of claim 5, wherein the length and strength of the hand gesture applying force and direction modulates the sound.

7. The method of claim 1, wherein applying said sound effect comprises operating at least one toggle switch on said displayed art effects.

8. The method of claim 7, wherein operating said at least one toggle switch creates a continuous audio effect.

9. The method of claim 1, wherein said display comprises a touch screen.

10. The method of claim 1, wherein said applying a sound effect comprises one of adding, adapting and modulating.

11. The method of claim 1, further comprising, after the step of running said video track in said display window, the steps of:

a. adding a sound effect to a given scene utilizing said performance area;

b. manually moving said sound effect to its proper position;

c. calculating the time difference between the position of said added sound effect and the position of said sound effect's proper position; and d. placing subsequent similar sound effects according to said calculation.

12. A system for interactively adding sound effects to movies, comprising:

a computing device having a display, said display comprising:

a video display window and a performance area, said computing device connected with an audio sounds library;

GUI means for running a video track in said display window; and

GUI means for applying a sound effect in real-time, in accordance with said video track using hand gestures applied to art effects displayed in said performance area.

13. The system of claim 12, further comprising GUI means for selecting a sound effect category and selecting a sound effect according to said selected category.

14. The system of claim 13, wherein said art effects are based on said selected category.

15. The system of claim 12, wherein said hand gestures comprise tapping on said displayed art effects.

16. The system of claim 15, comprising means for changing said sound effect depending on at least one of the direction of said tapping, the strength of said tapping, the area of said tapping and a sub-category selected.

17. The system of claim 12, wherein said hand gesture comprises applying force and direction to said displayed art effects.

18. The system of claim 17, comprising means for modulating said sound effect according to the length and strength of said force and direction of said hand gesture.

19. The system of claim 12, wherein said hand gesture comprises operating at least one toggle switch on said displayed art effects.

20. The system of claim 19, comprising means for creating a continuous audio effect triggered by said toggle.

21. The system of claim 12, wherein said display comprises a touch screen.

22. The system of claim 12, wherein said applying a sound effect comprises one of adding, adapting and modulating.

* * * * *